United States Patent
Rinne

(10) Patent No.: US 6,492,197 B1
(45) Date of Patent: Dec. 10, 2002

(54) TRILAYER/BILAYER SOLDER BUMPS AND FABRICATION METHODS THEREFOR

(75) Inventor: Glenn A. Rinne, Apex, NC (US)

(73) Assignee: Unitive Electronics Inc., Durham, NC (US)

( * ) Notice: Subject to any disclaimer, the term of this patent is extended or adjusted under 35 U.S.C. 154(b) by 0 days.

(21) Appl. No.: 09/576,477

(22) Filed: May 23, 2000

(51) Int. Cl.[7] .......................... H01L 21/44; H01L 21/48; H01L 21/50
(52) U.S. Cl. ...................... 438/108; 438/612; 438/613; 438/614; 438/615; 257/737; 257/738; 257/778; 257/779; 257/780; 257/781
(58) Field of Search ................................ 438/108, 612, 438/613, 614, 615; 257/737, 738, 778–779, 780, 781; 228/186.2

(56) References Cited

U.S. PATENT DOCUMENTS

| 4,505,029 A | * | 3/1985 | Owyang et al. ............... 29/589 |
| 4,673,772 A | | 6/1987 | Satoh et al. ............... 174/52 FP |
| 5,130,779 A | | 7/1992 | Agarwala et al. ............. 357/67 |

(List continued on next page.)

FOREIGN PATENT DOCUMENTS

| EP | 0 757 386 A2 | 2/1997 | ......... H01L/23/485 |
| JP | 54050269 | 4/1979 | ............ H01L/23/12 |
| JP | 0 4 133330 | 5/1992 | ......... H01L/21/321 |
| JP | 0 7 226400 | 8/1995 | ......... H01L/21/321 |
| WO | WO 97/03465 | 1/1997 | ............ H01L/21/92 |

OTHER PUBLICATIONS

Greer, *An Extended Eutectec Solder Bump fpr FCOB*, 1996 Electronic Components and Technology Conference, 1996, pp. 546–551.

International Serach Report for PCT/US01/14674, mailed Jan. 23, 2002.

*Primary Examiner*—John F. Niebling
*Assistant Examiner*—Lynne A. Gurley
(74) *Attorney, Agent, or Firm*—Myers Bigel Sibley & Sajovec

(57) ABSTRACT

Solder bumps are fabricated by plating a first solder layer on an underbump metallurgy, plating a second solder layer having higher melting point than the first solder layer on the first solder layer and plating a third solder layer having lower melting point than the second solder layer on the second solder layer. The structure then is heated to below the melting point of the second solder layer but above the melting point of the first solder layer and the third solder layer, to alloy at least some of the first solder layer with at least some of the underbump metallurgy and to round the third solder layer. Accordingly, a trilayer solder bump may be fabricated wherein the first and third layers melt at lower temperatures than the second solder layer, to thereby round the outer surface of the solder bump and alloy the base of the solder bump to the underbump metallurgy, while allowing the structure of the intermediate layer to be preserved. Solder bump fabrication as described above may be particularly useful with lead-tin solder wherein the first solder layer is eutectic lead-tin solder, the second solder layer is lead-tin solder having higher lead content than eutectic lead-tin solder and the third solder layer is eutectic lead-tin solder. In yet other embodiments, the thickness and/or composition of the outer underbump metallurgy layer and/or of the first solder layer may be selected so that upon heating, sufficient tin from the first solder layer is alloyed with at least some of the outer underbump metallurgy layer, such that the first solder layer is converted to a fourth solder layer having the same lead content as the second solder layer. Bilayer solder bumps thereby may be provided.

46 Claims, 2 Drawing Sheets

U.S. PATENT DOCUMENTS

| | | | |
|---|---|---|---|
| 5,147,084 A | 9/1992 | Behun et al. | 228/56.3 |
| 5,251,806 A | 10/1993 | Agarwala et al. | 228/180.22 |
| 5,470,787 A | 11/1995 | Greer | 437/183 |
| 5,542,174 A | 8/1996 | Chiu | 29/840 |
| 5,553,769 A | 9/1996 | Ellerson et al. | 228/123.1 |
| 5,609,287 A | 3/1997 | Izuta et al. | 228/123.1 |
| 5,796,591 A * | 8/1998 | Dalal et al. | 438/614 |
| 5,859,470 A | 1/1999 | Ellerson et al. | 257/772 |
| 5,906,312 A * | 5/1999 | Zakel et al. | 228/246 |
| 5,920,125 A | 7/1999 | Ellerson et al. | 257/778 |
| 6,083,773 A * | 7/2000 | Lake | 438/108 |
| 6,281,106 B1 * | 8/2001 | Higdon et al. | 438/613 |
| 6,346,469 B1 * | 2/2002 | Greer | 438/614 |

\* cited by examiner

TRILAYER/BILAYER SOLDER BUMPS AND FABRICATION METHODS THEREFOR

FIELD OF THE INVENTION

This invention relates to microelectronic devices and fabrication methods therefor, and more particularly to structures and methods of forming electrical and mechanical connections for a microelectronic substrate, and the connections so formed.

BACKGROUND OF THE INVENTION

Solder bump technology is widely used for electrical and mechanical interconnection of microelectronic substrates. For example, an integrated circuit chip may be connected to a circuit board or other next level packaging substrate using solder bumps. This connection technology also is referred to as "Controlled Collapse Chip Connection—C4" or "flip-chip" technology, and will be referred to herein as "solder bumps".

In solder bump technology, an "UnderBump Metallurgy" (UBM) may be formed on a microelectronic substrate having contact pads thereon, for example by evaporation and/or sputtering. A continuous underbump metallurgy generally is provided on the pads and on the substrate between the pads, in order to allow current flow during subsequent solder plating.

In order to define the sites for solder bump formation over the contact pads, a mask is formed, for example by forming a thick layer of photoresist on the underbump metallurgy and patterning the photoresist to expose the underbump metallurgy over the contact pads. Solder pads then may be formed on the exposed areas of the underbump metallurgy, over the contact pads, by electroplating. The plated solder accumulates in the cavities of the photoresist, over the contact pads. The underbump metallurgy between the plated solder then may be etched, using the solder as an etch mask, to break the electrical connection between the solder bumps. The plated solder then may be reflowed to form solder bumps. During reflow, the solder bump also may alloy with the underbump metallurgy, to form an intermetallic. Solder bump fabrication methods and structures are described in U.S. Pat. No. 5,162,257 to Yung; U.S. Pat. No. 5,293,006 to Yung; U.S. Pat. No. 5,447,264 to Koopman et al.; U.S. Pat. No. 5,767,010 to Mis et al.; U.S. Pat. No. 5,793,116 to Rinne et al.; U.S. Pat. No. 5,892,179 to Rinne et al.; U.S. Pat. No. 5,902,686 to Mis; and U.S. Pat. No. 5,963,793 to Rinne et al., and need not be described further herein.

As microelectronic technology continues to advance, it may become increasingly desirable to use solder bump technology in an increasing variety of microelectronic devices. Conventional solder bumps use alloys of lead (Pb)-tin (Sn) solder. In these solder bumps, it may be desirable to maintain a high lead content to allow a high degree of flexibility in the solder bump, which can thereby absorb mechanical stresses that may be caused by thermal expansion coefficient mismatches between the substrates that are connected by the solder bumps. Unfortunately, as the lead content of lead-tin solder increases above or below 37% from eutectic lead-tin solder (63 Sn-37 Pb), the melting point of the solder bump generally increases. This increased melting point may require higher temperatures for solder reflow and/or joining. These higher temperatures may damage microelectronic devices in a microelectronic substrate. Moreover, it may be more difficult to form a strong connection between the solder bump and the underbump metallurgy as the lead content continues to increase.

Attempts to provide high performance solder bump connections are described in U.S. Pat. No. 4,673,772 to Satoh et al.; U.S. Pat. Nos. 5,130,779 and 5,251,806 to Agarwala et al.; U.S. Pat. No. 5,542,174 to Chiu; U.S. Pat. Nos. 5,553,769, 5,859,470 and 5,920,125 to Ellerson et al.; U.S. Pat. No. 5,470,787 to Greer; and in a publication entitled An Extended Eutectic Solder Bump for FCOB to Greer, 1996 Electronic Components and Technology Conference, pp. 546–551. However, notwithstanding these and other attempts, there continues to be a need for solder bumps and fabrication methods that can maintain a high lead content, can reflow at relatively low temperatures and/or can alloy effectively with an underbump metallurgy.

SUMMARY OF THE INVENTION

The present invention can provide trilayer/bilayer solder bump fabrication methods by plating a first solder layer on an underbump metallurgy, plating a second solder layer having higher melting point than the first solder layer on the first solder layer and plating a third solder layer having lower melting point than the second solder layer on the second solder layer. The structure then is heated to below the melting point of the second solder layer but above the melting point of the first solder layer and the third solder layer, to alloy at least some of the first solder layer with at least some of the underbump metallurgy and to round the third solder layer. Accordingly, a trilayer solder bump may be fabricated wherein the first and third solder layers melt at lower temperatures than the second solder layer, to thereby round the outer surface of the solder bump and to alloy the base of the solder bump to the underbump metallurgy, while allowing the structure of the intermediate layer to be preserved.

Solder bump fabrication as described above may be particularly useful with lead-tin solder wherein the first solder layer comprises eutectic lead-tin solder, the second solder layer comprises lead-tin solder having higher lead content than eutectic lead-tin solder and the third solder layer comprises eutectic lead-tin solder. In these embodiments, the first and third eutectic lead-tin solder layers can provide a lowest melting point for rounding the top and alloying the base of the solder bump. However, the high lead content of the intermediate (second) solder layer may be preserved to provide flexibility for the bump. Moreover, since the first, second and third solder layers are plated, the columnar plated structure within the intermediate solder layer may be preserved, to thereby allow further increases in flexibility. Thus, the second solder layer may be maintained in its "as plated" condition.

Embodiments of the invention may be used with underbump metallurgy systems that include an outer layer of copper. In these embodiments, heating may be performed to alloy sufficient tin from the first solder layer with at least some of the outer layer comprising copper, such that the first solder layer is converted to a fourth solder layer having the same lead content as the second solder layer. This can create a bilayer solder bump wherein the second and fourth solder layers have the same lead content, after reflow, and a eutectic third (outer) rounded layer caps the second solder layer. In yet other embodiments, heating is performed to alloy at least some tin from the first solder layer with at least some of the copper outer layer of the underbump metallurgy, such that the first solder layer is converted to a fourth solder layer having higher lead content than eutectic lead-tin solder, but not having the same lead content as the second solder layer. Accordingly, these embodiments may provide trilayer reflowed solder bumps.

In yet other embodiments, the thickness and/or composition of the copper outer layer and/or of the first solder layer may be selected so that upon heating, sufficient tin from the first solder layer is alloyed with all of the copper in the outer underbump metallurgy layer, such that the first solder layer is converted to a fourth solder layer having same lead content as the second solder layer. Bilayer solder bumps thereby may be provided. In yet other embodiments, the thickness and/or composition of the first solder layer and/or of the outer layer of the underbump metallurgy maybe selected to alloy some tin from the first solder layer with all of the copper in the outer layer, such that all of the outer layer is converted to copper-tin alloy and the first solder layer is converted to a fourth solder layer having higher lead content than eutectic lead-tin solder, but not the same lead content as the second solder layer.

Other embodiments of the present invention may be used with underbump metallurgy systems having a nickel outer layer. As was described above in connection with a copper outer underbump metallurgy layer, the thickness and/or composition of the nickel underbump metallurgy layer and/or of the first solder layer may be controlled to alloy some or all of the nickel and/or convert the first solder layer to higher lead-tin content than eutectic lead-tin solder or the same lead content as the second solder layer.

In yet other embodiments of the invention, the first solder layer comprises about 3000 Å of eutectic lead-tin solder, the second solder layer preferably comprises about 40 microns of solder having higher lead content than eutectic lead-tin solder, and the third solder layer preferably comprises at least about 10 microns of eutectic lead-tin solder. In order to convert all of the underbump metallurgy outer copper layer to copper-tin alloy, about 5000 Å of copper may be provided. However, other thicknesses and compositions may be provided according to embodiments of the present invention.

Embodiments of solder bump structures according to the present invention include an underbump metallurgy, a first plated solder layer on the underbump metallurgy, a second plated solder layer on the first solder layer having higher melting point than the first solder layer, and a third plated solder layer on the second solder layer having lower melting point than the second solder layer. In other embodiments, the first plated solder layer and the third plated solder both comprise eutectic lead-tin solder, whereas the second plated solder layer comprises lead-tin solder having higher lead content than eutectic lead-tin solder. The underbump metallurgy preferably includes an outer layer comprising copper or nickel. In yet other embodiments, the second plated solder layer may be wider than the first plated solder layer and the third plated solder layer may be wider than the second plated solder layer. In still other embodiments, the first, second and third plated solder layers each include a plurality of columnar grains that extend across the thickness thereof. Embodiments of solder bump structures of this paragraph may form intermediate structures prior to reflow.

In other embodiments, the first solder layer comprises about 3000 Å of eutectic lead-tin solder, the underbump metallurgy includes an outer layer of copper of about 5000 Å in thickness, the second solder layer is about 40 microns in thickness, and the third solder layer is at least about 10 microns in thickness. In other embodiments, the third solder layer comprises lead-tin solder having higher lead content than eutectic lead-tin solder, but lower lead content than the second solder layer. Embodiments of this paragraph also may form intermediate structures prior to reflow.

Other embodiments of solder bump structures according to the present invention include an intermetallic layer comprising an alloy of tin and material other than lead, an intermediate solder layer on the intermetallic layer, and an outer solder layer on the intermediate solder layer having lower melting point than the intermediate solder layer. The intermediate solder layer preferably comprises lead-tin solder having higher lead content than eutectic lead-tin solder, and the outer solder layer preferably comprises eutectic lead-tin solder. The intermetallic layer may comprise an alloy of tin and copper, or an alloy of tin and nickel. In these embodiments, the outer solder layer may be wider than the intermetallic layer. Embodiments of this paragraph may form final solder bump structures after reflow.

In other embodiments, the intermediate solder layer may be about 40 microns in thickness, and the outer solder layer may be at least about 10 microns in thickness. The intermediate solder layer preferably includes columnar grains that extend across the thickness thereof, and the outer solder layer preferably includes a rounded outer surface. Embodiments of this paragraph also may form final solder bump structures after reflow.

Other embodiments of solder bump structures according to the present invention include an underbump metallurgy, a rounded solder bump cap and a solder bump body between the underbump metallurgy and the rounded solder bump cap. The solder bump is wider adjacent the rounded solder bump cap than adjacent the underbump metallurgy. In other embodiments, the solder bump body increases in width from adjacent the underbump metallurgy to adjacent the rounded solder bump cap. In yet other embodiments, the solder bump body continuously increases in width from adjacent the underbump metallurgy to adjacent the rounded solder bump cap. These increased width solder bumps may provide high density connections to underbump metallurgy and large surface area outer connections to other microelectronic substrates.

Accordingly, solder bumps and fabrication methods may be fabricated that can maintain high lead content, low temperature reflow, effective alloying with an underbump metallurgy layer and/or as plated columnar grain structures.

DETAILED DESCRIPTION OF THE PREFERRED EMBODIMENT

Figure 1:
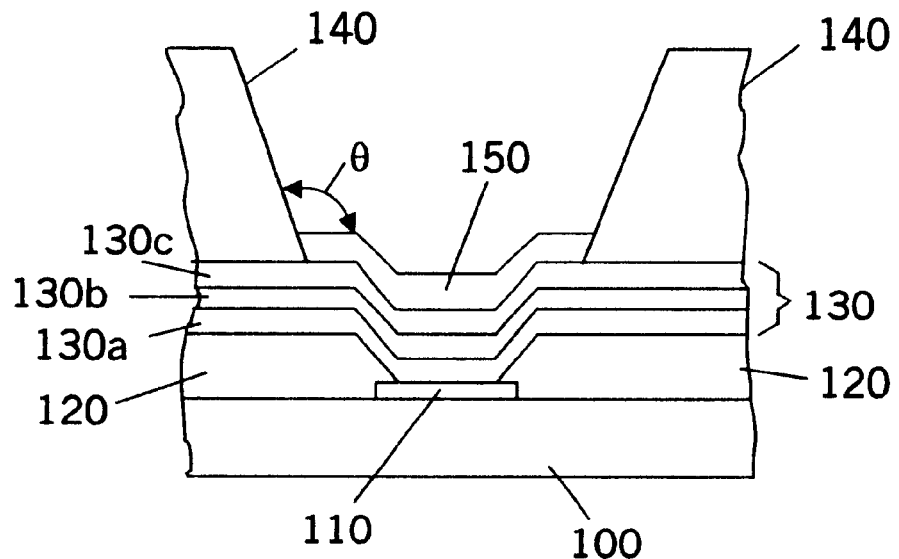
FIGS. 1–5 are cross-sectional views of solder bumps and fabrication methods according to the present invention, during intermediate and final fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the dimensions of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Referring now to FIG. 1, a first solder layer is plated on an underbump metallurgy. In particular, a microelectronic substrate 100 such as an integrated circuit substrate, printed circuit board, glass and/or ceramic substrate includes a contact pad 110 which may comprise copper and/or other materials on the surface thereof, and a passivating layer 120 which may comprise silicon dioxide and/or other materials. The fabrication of contact pads 110 and passivating layers 120 on microelectronic substrates 100 are well known to those having skill in the art and need not be described further herein. It also will be understood that a discrete contact pad need not be provided, but rather an exposed conductive area within the microelectronic substrate 100 may be provided instead.

Still continuing with the description of FIG. 1, an Under-Bump Metallurgy (UBM) 130 is provided on the substrate 100, electrically contacting the contact pad 110. In first embodiments of the invention, a phased underbump metallurgy may be provided that includes a first layer 130a comprising chromium (Cr), a second layer 130b comprising an intermetallic of chromium and copper (Cu) and a third (outer) layer 130c comprising copper. Other combinations of materials also may be used. The fabrication of phased underbump metallurgy is well known to those having skill in the art and need not be described in detail herein.

In other embodiments, a discrete underbump metallurgy 130 may be provided that includes, for example a first underbump metallurgy layer 130a comprising titanium, a second underbump metallurgy layer 130b comprising copper, and a third (outer) underbump metallurgy layer 130c comprising nickel. Other discrete underbump metallurgy layers 130 also may be provided. Moreover, other single or multiple layer underbump metallurgies may be provided using materials and techniques well known to those having skill in the art.

Still continuing with the description of FIG. 1, a plating mask 140 then is formed on the underbump metallurgy 130 over the contact pad 110. The plating mask 140 may comprise photoresist or other conventional masking materials and may be formed using photolithography and/or other conventional techniques. The plating mask 140 preferably includes oblique sidewalls that form an obtuse angle θ with the exposed underbump metallurgy, preferably an obtuse angle between about 110° to about 115° and more preferably about 111°. By providing an obtuse plating angle as illustrated in FIG. 1, the solder bump that is formed on the underbump metallurgy, as will be described below, can have a wider top than the base. The relatively narrow base can provide high density connections to the substrate 100 and can allow etching of the underbump metallurgy outside the contact pad 110 with higher reliability. Moreover, the wide top can provide improved connections to a second microelectronic substrate, for example by allowing the relatively large volume wide top to absorb nonplanarities in the second microelectronic substrate during reflow. However, it will be understood that oblique sidewalls that make an acute angle θ and/or sidewalls that are orthogonal to the substrate (θ=90°) also may be provided.

Finally, still referring to FIG. 1, a first solder layer 150 is plated on the underbump metallurgy 130. By plating the first solder layer, a columnar grain structure may be provided in the first solder layer 150. The first solder layer preferably is eutectic (such as 63 Sn-37 Pb) solder, the thickness of which may be selected as will be described below. In one embodiment, the first solder layer comprises about 3000 Å of eutectic lead-tin solder.

Figure 2:
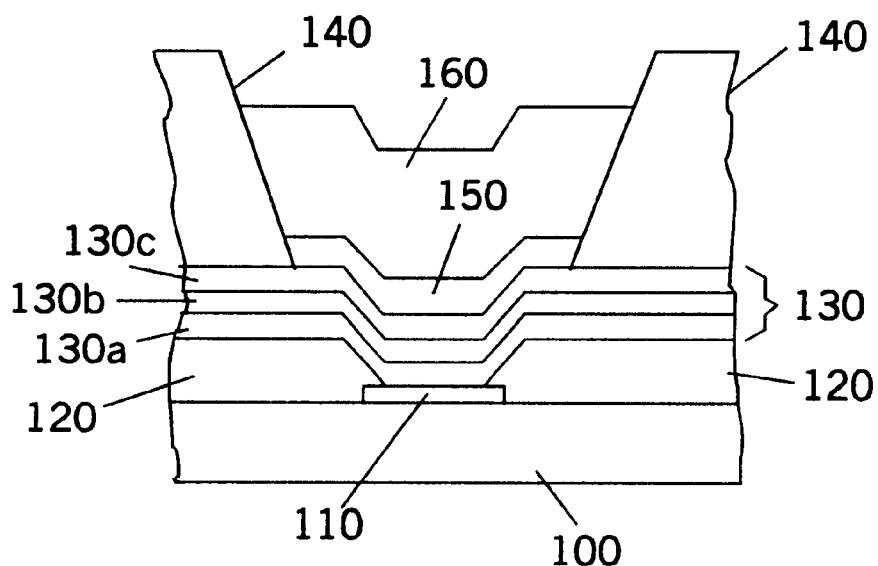

Referring now to FIG. 2, a second solder layer 160 having a higher melting point than the first solder layer 150, is plated on the first solder layer 150. By plating, the columnar grain structure preferably is preserved in the second solder layer 160. The second solder layer 160 preferably has a higher melting point than the first solder layer 150 by providing higher lead content than eutectic lead-tin solder in the second solder layer 160. In a specific embodiment, about 40 microns of 95 Pb-5 Sn solder is provided. Accordingly, a relatively thick second solder layer is provided that has a high lead content and a columnar grain structure for increased flexibility.

Figure 3:
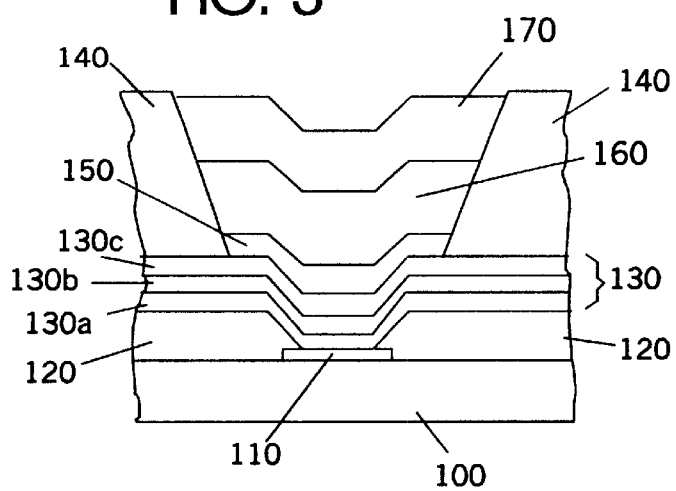

Referring now to FIG. 3, a third solder layer 170, having a lower melting point than the second solder layer 160, then is plated on the second solder layer 160. In order to provide a lower melting point, the third solder layer 170 preferably comprises solder having a lower lead content than the second solder layer 160. More preferably, the third solder layer comprises eutectic lead-tin solder. In a specific embodiment, the third solder layer 170 comprises at least about 10 microns of eutectic lead-tin solder. The third solder layer 170 also may extend onto the plating mask 140.

Figure 6:
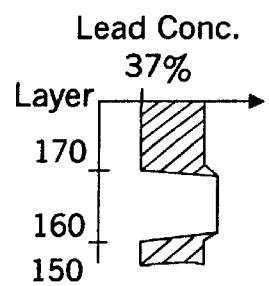
FIGS. 6–8 graphically illustrate lead concentration in solder bumps of FIGS. 3–5, respectively.

FIG. 6 graphically illustrates the lead concentration or content of lead-tin solders in the first, second and third solder layers 150, 160 and 170 according to embodiments of the present invention. Specifically, as shown in FIG. 6, the second solder layer 160 has a predetermined lead concentration. The first and third solder layers 150 and 170 have a lead concentration that is lower than that of the second solder layer, and may have concentrations that decrease down to 37%, corresponding to eutectic lead-tin solder. Lead concentrations below eutectic lead-tin solder also may be used. It will be understood that eutectic lead-tin solder preferably is used for the first and third solder layers 150 and 170, to allow reflow and/or joining at the lowest possible temperature, approximately 183° C.

Figure 4:
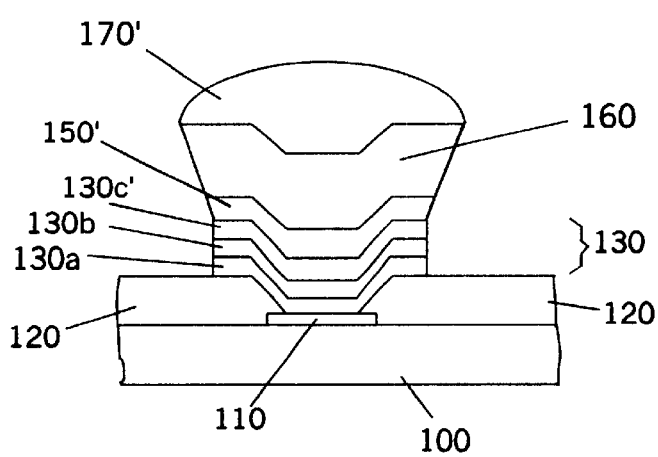

Referring now to FIG. 4, the plating mask 140 is removed, and the underbump metallurgy 130 is removed outside the first solder layer 150. For example, the plating mask 140 may be dissolved, and the underbump metallurgy 130 may be etched using conventional techniques. Then, as shown in FIG. 4, the structure is heated to below the melting point of the second solder layer 160, but above the melting point of the first solder layer 150 and the third solder layer 170. In one embodiment, reflow may take place at about 200° C. for about 60 seconds, above the melting point (183° C.) of eutectic lead-tin solder, but well below the melting point of 95 Pb-5 Sn solder (363° C.). Other times and/or temperatures may be used.

As shown in FIG. 4, at least two changes may take place during reflow. First, the third solder layer 170 is rounded to form an outer solder layer 170' having a rounded outer surface. Stated differently, a rounded cap 170' is formed. It will be understood that the composition of the third solder layer 170 preferably does not change in forming the rounded cap 170' because little or no diffusion takes place into or from the second solder layer 160, which preferably does not melt at the reflow temperature.

Figure 7:
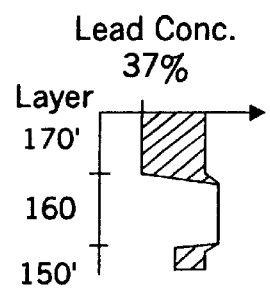

A second change is that at least some of the first solder layer 150 alloys with at least some of the outer layer 130c of the underbump metallurgy 130, to thereby form an intermetallic layer 130c' of material from the third (outer) underbump metallurgy layer 130c and the first solder layer 150. The lead concentration of the first solder layer 150 increases after reflow due to the diffusion of tin into the intermetallic layer 130c'. Accordingly, a tin-depleted first solder layer 150' is formed. Due to the tin depletion, the tin-depleted first solder layer 150'b may be thinner than the first solder layer 150. Accordingly, as shown in FIG. 7, the lead content of the rounded cap 170' remains the same as the third solder layer 170 of FIG. 6 but the lead concentration of the depleted first solder layer 150' increases compared to that of the third solder layer 150 of FIG. 6.

The formation of intermetallics as a function of time, temperature and composition of two adjacent layers is well known to those having skill in the art. Accordingly, the thickness and/or composition of the outer underbump metallurgy layer 130c and the first solder layer 150 may be selected so that some or all of the outer underbump metallurgy layer 130c is converted to the intermetallic layer 130c' as shown. Alternatively, some but not all of the outer underbump metallurgy layer 130c may be converted to the intermetallic layer 130c'. Moreover, the lead concentration in the depleted first solder layer 150' may increase up to that of the second solder layer 160. By forming the intermetallic layer 130c, effective wetting and mechanical joining of the solder bump to the underbump metallurgy may be provided.

The thickness and composition of the intermetallic layer 130c' may depend upon the composition and/or thickness of the outer underbump metallurgy layer 130c. For example, when the outer underbump metallurgy 130c comprises copper, it may be desirable to convert the entire outer underbump metallurgy layer 130c to a copper-tin intermetallic layer 130c'. In contrast, when the outer underbump metallurgy layer 130c comprises nickel, only a sufficient amount of the nickel may need to be converted to nickel-tin intermetallic to provide wettability. The entire outer underbump metallurgy layer 130c may not need to be converted to an intermetallic layer 130c'.

Still referring to FIG. 4, it will be noted that the second solder layer 160 does not melt during reflow. Accordingly, the columnar grain structure thereof may be maintained throughout the thickness of the second solder layer 160, to thereby maintain flexibility of the solder bump that ultimately is formed. It will be understood that the columnar grain structure of the first and third solder layers 150' and 170' may be reduced or eliminated due to the reflow. However, if the reflow temperature is maintained just slightly below the eutectic temperature, i.e. just slightly below 183°, the columnar grain structure may be maintained in the depleted first solder layer 150' as well. Thus, at a reflow temperature of 170° C., much of the columnar grain structure may be maintained in the depleted first solder layer 150'.

Figure 5:
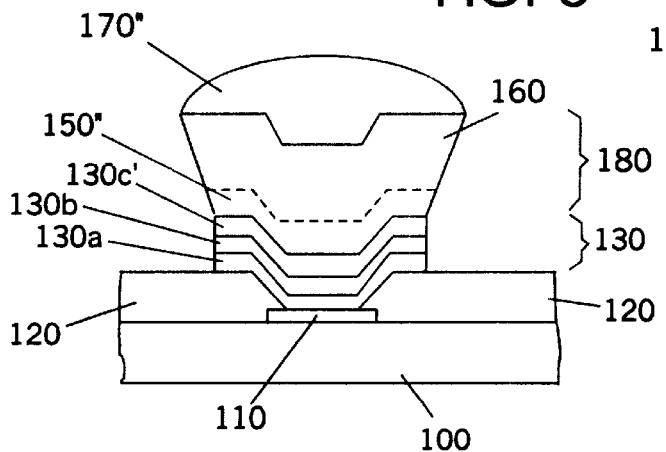

FIG. 5 illustrates alternative embodiments of FIG. 4, wherein specific configurations (compositions and/or thickness) of first, second and third solder layers and outer underbump metallurgy layers may be selected so that upon heating, the first solder layer is converted to a fourth solder layer having the same lead content as the second solder layer. Bilayer solder bumps thereby may be provided.

More specifically, fabrication proceeds as was described in connection with FIGS. 1–3. However, the first solder layer 150 preferably comprises about 3000 Å of eutectic lead-tin solder, the second solder layer 160 preferably comprises about 40 microns of 95 Pb-5 Sn solder and third solder layer 170 preferably comprises at least about 10 microns of eutectic lead-tin solder. Moreover, the outer underbump metallurgy layer 130c preferably comprises about 5000 Å of copper.

Figure 8:
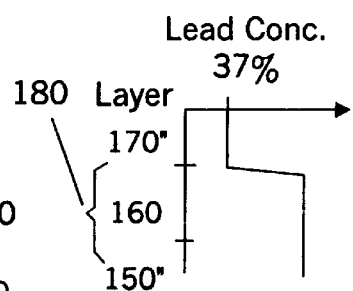

Upon reflow, as shown in FIG. 5, a rounded cap 170" of eutectic lead-tin solder is formed, similar to FIG. 4. Moreover, all of the outer underbump metallurgy layer 130c is converted to an intermetallic layer 130c' that comprises, for example, $Cu_3Sn$ and/or $Cu_6Sn_5$. Finally, sufficient tin is depleted from the first solder layer 150 during intermetallic formation to raise the lead concentration of the depleted first solder layer 150" to be the same as that of the second solder layer 160. The boundary between the depleted first solder layer 150" and the second solder layer 160 can all but disappear as shown by the dashed line therebetween, to provide a uniform, high lead concentration solder bump body 180 that is capped by a rounded cap 170". The uniform high lead content solder bump body 180 illustrated graphically in FIG. 8.

Thus, the tin that is consumed by the intermetallic formation causes lower concentration in the first eutectic solder layer 150, thus increasing the melting point. In FIG. 5, the first solder layer 150 preferably is just thick enough to provide enough tin for full conversion of the copper in the underbump metallurgy to an intermetallic layer 130c'. An etch stop thereby may be formed. Once complete, the solder bump has a configuration of a high lead bump body 180, except that the high lead portion 160 is still in the as plated state and capped with reflowed eutectic 170". The depleted first solder layer 150" also may maintain its as plated structure, including columnar grains therethrough if the reflow temperature is maintained just slightly below the eutectic temperature, for example 170° C. In FIG. 5, after reflow, the distinct identity of the first solder layer 150 can all but disappear, since the tin will have diffused into the underlying copper layer 130c'. The top eutectic layer forms a semi-spherical cap 170" due to surface tension in the liquid phase.

Embodiments of intermediate solder bump structures according to the present invention, for example as illustrated in FIG. 3, include an underbump metallurgy 130, a first plated solder layer 150 on the underbump metallurgy, a second plated solder layer 160 on the first solder layer 150 having higher melting point than the first solder layer 150 and a third plated solder layer 170 on the second solder layer 160 having lower melting point than the second solder layer 160. The first plated solder layer 150 preferably comprises eutectic lead-tin solder, the second plated solder layer 160 preferably comprises lead-tin solder having higher lead content than eutectic lead-tin solder and the third plated solder layer 170 preferably comprises eutectic lead-tin solder. The underbump metallurgy preferably includes an outer layer 130c comprising copper or nickel. The first solder layer 150 preferably comprises about 3000 Å of eutectic lead-tin solder, the second solder layer 160 preferably comprises about 40 microns of high lead content solder, and the third solder layer preferably comprises at least about 10 microns of eutectic lead-tin solder. The outer underbump metallurgy layer 130c preferably includes about 3000 Å of copper. The first, second and third plated solder layers 150, 160 and 170 preferably each includes a plurality of columnar grains that extend across the thickness thereof. The second plated solder layer 160 preferably is wider than the first plated solder layer 150 and the third plated solder layer 170 preferably is wider than the second plated solder layer 160. Preferably the width increases continuously and most preferably uniformly, from the underbump metallurgy 130 to the outer surface of the third plated solder layer 170.

Embodiments of reflowed solder bump structures, as shown in FIG. 4, preferably comprise an intermetallic layer 130c' comprising an alloy of tin and material other than lead. A depleted first solder layer 150' is on the intermetallic layer 130' and an intermediate second solder layer 160 is on the depleted first solder layer 150'. An outer solder layer 170' is on the intermediate solder layer 160 and has a lower melting point than the intermediate solder layer 160. The intermediate solder layer 160 preferably comprises lead-tin solder having a higher lead content than eutectic lead-tin solder, and the outer solder layer 170' preferably comprises eutectic lead-tin solder. The intermetallic layer 130c' preferably comprises an alloy of tin and copper, or an alloy of tin and nickel. The intermediate solder layer 160 preferably comprises 95 Pb-5 Sn solder of about 40 microns in thickness and the outer solder layer 170' preferably is at least about 10 microns in thickness. The outer solder layer 170' preferably includes a rounded outer surface. The width of the solder bump preferably increases from the underbump metallurgy 130 to the outer solder layer 170', preferably continuously and more preferably uniformly.

Embodiments of reflowed solder bump structures according to the present invention, for example as shown in FIG. 5, include an underbump metallurgy 130, a rounded solder bump cap 170" and a solder bump body 180 between the underbump metallurgy 130 and the rounded solder bump cap 170", wherein the solder bump body 180 is wider adjacent the rounded solder bump cap 170" than adjacent the underbump metallurgy 130. More preferably, the solder bump body 180 increases in width from adjacent the underbump metallurgy 130 to adjacent the rounded solder bump cap 170". Most preferably, the width of the solder bump body 180 increases continuously and even more preferably uniformly, from adjacent the underbump metallurgy 130 to adjacent the rounded solder bump cap 170". The underbump metallurgy preferably includes an intermetallic layer 130c' of tin and material other than lead. The solder bump body 180 preferably comprises lead-tin solder having higher lead content than eutectic lead-tin solder, such as 95 Pb-5 Sn. The rounded solder cap 170" preferably comprises eutectic lead-tin solder.

Accordingly, embodiments of solder bumps and fabrication methods according to the present invention can provide a low melting point cap and base that can round and alloy with the underbump metallurgy, respectively, upon reflow at low temperatures, while allowing the high lead content and/or columnar grain structure of the bulk of the solder bump to be preserved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a solder bump comprising:
   plating a first solder layer on an underbump metallurgy;
   plating a second solder layer having higher melting point than the first solder layer on the first solder layer;
   plating a third solder layer having lower melting point than the second solder layer on the second solder layer; and
   heating to below the melting point of the second solder layer but above the melting point of the first solder layer and the third solder layer to alloy at least some of the first solder layer with at least some of the underbump metallurgy and to round the third solder layer.

2. A method of forming a solder bump comprising:
   plating a first solder layer comprising eutectic lead-tin solder on an underbump metallurgy;
   plating a second solder layer comprising lead-tin solder having higher lead content than eutectic lead-tin solder on the first solder layer;
   plating a third solder layer comprising eutectic lead-tin solder on the second solder layer; and
   heating to below a melting point of the second solder layer but above a melting point of the first solder layer and the third solder layer to alloy at least some of the first solder layer with at least some of the underbump metallurgy and to round the third solder layer.

3. A method according to claim 2 wherein the underbump metallurgy includes an outer layer comprising copper and wherein the heating step comprises:
   heating to alloy sufficient tin from the first solder layer with at least some of the outer layer comprising copper such that the first solder layer is converted to a fourth solder layer having same lead content as the second solder layer.

4. A method according to claim 2 wherein the underbump metallurgy includes an outer layer comprising copper and wherein the heating step comprises:
   heating to alloy at least some tin from the first solder layer with at least some of the outer layer comprising copper such that the first solder layer is converted to a fourth solder layer having higher lead content than eutectic lead-tin solder.

5. A method according to claim 2 wherein the underbump metallurgy includes an outer layer comprising copper and wherein the heating step comprises:
   heating to alloy sufficient tin from the first solder layer with all of the copper is in the outer layer such that the first solder layer is converted to a fourth solder layer having same lead content as the second solder layer.

6. A method according to claim 2 wherein the underbump metallurgy includes an outer layer comprising copper and wherein the heating step comprises:
   heating to alloy at least some tin from the first solder layer with all of the copper in the outer layer such that the outer layer is converted to copper-tin alloy and the first solder layer is converted to a fourth solder layer having higher lead content than eutectic lead-tin solder.

7. A method according to claim 2 wherein the underbump metallurgy includes an outer layer comprising copper and wherein the heating step comprises:
   heating to alloy some tin from the first solder layer with all of the copper in the outer layer such that all the outer layer is converted to copper-tin alloy and the first solder layer is converted to a fourth solder layer having same lead content as the second solder layer.

8. A method according to claim 2 wherein the underbump metallurgy includes an outer layer comprising nickel and wherein the heating step comprises:
   heating to alloy sufficient tin from the first solder layer with at least some of the outer layer comprising nickel such that the first solder layer is converted to a fourth solder layer having same lead content as the second solder layer.

9. A method according to claim 2 wherein the underbump metallurgy includes an outer layer comprising nickel and wherein the heating step comprises:
   heating to alloy at least some tin from the first solder layer with at least some of the outer layer comprising nickel such that the first solder layer is converted to a fourth solder layer having higher lead content than eutectic lead-tin solder.

10. A method according to claim 2 wherein the underbump metallurgy includes an outer layer comprising nickel and wherein the heating step comprises:
    heating to alloy sufficient tin from the first solder layer with all of the outer layer comprising nickel such that the first solder layer is converted to a fourth solder layer having same lead content as the second solder layer.

11. A method of forming a solder bump comprising:

plating a first solder layer comprising about 3000 Å of eutectic lead-tin solder on an underbump metallurgy;

plating a second solder layer comprising lead-tin solder having higher lead content than eutectic lead-tin solder on the first solder layer;

plating a third solder layer comprising eutectic lead-tin solder on the second solder layer; and heating to below a melting point of the second solder layer but above a melting point of the first solder layer and the third solder layer to alloy at least some of the first solder layer with at least some of the underbump metallurgy and to round the third solder layer.

12. A method according to claim 11 wherein the underbump metallurgy includes an outer layer comprising about 5000 Å of copper and wherein the heating step comprises:

heating to alloy some tin from the first solder layer with all of the 5000 Å of copper in the outer layer such that the outer layer is converted to copper-tin alloy and the first solder layer is converted to a fourth solder layer having same lead content as the second solder layer.

13. A method according to claim 1:

wherein the step of plating a second solder layer comprises plating a second solder layer that is about 40 microns in thickness on the first solder layer; and wherein the step of plating a third solder layer comprises plating a third solder layer that is at least about 10 microns in thickness on the second solder layer.

14. A method according to claim 1:

wherein the step of plating a first solder layer comprises plating a first solder layer that is about 3000 Å in thickness on an underbump metallurgy including an outer layer comprising about 5000 Å of copper;

wherein the step of plating a second solder layer comprises plating a second solder layer that is about 40 microns in thickness on the first solder layer; and wherein the step of plating a third solder layer comprises plating a third solder layer that is at least about 10 microns in thickness on the second solder layer.

15. A method of forming a solder bump comprising:

forming on an underbump metallurgy, a first solder layer of about 3000 Å in thickness, a second solder layer of about 40 microns in thickness on the first solder layer and having higher melting point than the first solder layer and a third solder layer of at least about 10 microns in thickness and having lower melting point than the second solder layer; and heating to below the melting point of the second solder layer but above the melting point of the first solder layer and the third solder layer.

16. A method according to claim 15 wherein the forming steps comprises:

plating a first solder layer of about 3000 Å in thickness on an underbump metallurgy;

plating a second solder layer of about 40 microns in thickness and having higher melting point than the first solder layer on the first solder layer; and plating a third solder layer of at least about 10 microns in thickness and having lower melting point than the second solder layer on the second solder layer.

17. A method of forming a solder bump comprising:

forming on an underbump metallurgy, a first solder layer comprising eutectic lead-tin solder of about 3000 Å in thickness, a second solder layer comprising lead-tin solder having higher lead content than eutectic lead-tin solder of about 40 microns in thickness on the first solder layer, and a third solder layer comprising eutectic lead-tin solder of at least about 10 microns in thickness on the second solder layer.

18. A method according to claim 17 wherein the underbump metallurgy includes an outer layer comprising copper and wherein the heating step comprises:

heating to alloy sufficient tin from the first solder layer with at least some of the outer layer comprising copper such that the first solder layer is converted to a fourth solder layer having same lead content as the second solder layer.

19. A method according to claim 17 wherein the underbump metallurgy includes an outer layer comprising copper and wherein the heating step comprises:

heating to alloy at least some tin from the first solder layer with all of the copper in the outer layer such that the outer layer is converted to copper-tin alloy and the first solder layer is converted to a fourth solder layer having higher lead content than eutectic lead-tin solder.

20. A method according to claim 17 wherein the underbump metallurgy includes an outer layer comprising copper and wherein the heating step comprises:

heating to alloy some tin from the first solder layer with all of the copper in the outer layer such that the outer layer is converted to copper-tin alloy and the first solder layer is converted to a fourth solder layer having same lead content as the second solder layer.

21. A method according to claim 17 wherein the underbump metallurgy includes an outer layer comprising nickel and wherein the heating step comprises:

heating to alloy sufficient tin from the first solder layer with at least some of the outer layer comprising nickel such that the first solder layer is converted to a fourth solder layer having higher lead content than eutectic lead-tin solder.

22. A method according to claim 17 wherein the underbump metallurgy includes an outer layer comprising nickel and wherein the heating step comprises:

heating to alloy at least some tin from the first solder layer with at least some of the outer layer comprising nickel such that the first solder layer is converted to a fourth solder layer having higher lead content than eutectic lead-tin solder.

23. A method according to claim 17 wherein the underbump metallurgy includes an outer layer comprising nickel and wherein the heating step comprises:

heating to alloy sufficient tin from the first solder layer with at least some of the outer layer comprising nickel such that the first solder layer is converted to a fourth solder layer having same lead content as the second solder layer.

24. A method according to claim 17 wherein the underbump metallurgy includes an outer layer comprising about 5000 Å of copper and wherein the heating step comprises:

heating to alloy some tin from the first solder layer with all of the 5000 Å of copper in the outer layer such that the outer layer is converted to copper-tin alloy and the first solder layer is converted to a fourth solder layer having same lead content as the second solder layer.

25. A solder bump structure comprising:

an underbump metallurgy;

a first plated solder layer comprising eutectic lead-tin solder on the underbump metallurgy;

a second plated solder layer comprising lead-tin solder having higher lead content than eutectic lead-tin solder on the first solder layer; and a third plated solder layer comprising eutectic lead-tin solder on the second solder layer.

26. A structure according to claim 25 wherein the underbump metallurgy includes an outer layer comprising copper.

27. A structure according to claim 25, wherein the underbump metallurgy includes an outer layer comprising nickel.

28. A structure according to claim 25, wherein the first solder layer comprises about 3000 Å of eutectic lead-tin solder.

29. A structure according to claim 25, wherein the underbump metallurgy includes an outer layer comprising about 5000 Å of copper.

30. A solder bump structure comprising:

an underbump metallurgy;

a first plated solder layer on the underbump metallurgy;

a second plated solder layer on the first solder layer having higher melting point than the first solder layer; and a third plated solder layer on the second solder layer having lower melting point than the second solder layer;

wherein the first solder layer is about 3000 Å in thickness, the second solder layer that is about 40 microns in thickness and the third solder layer that is at least about 10 microns in thickness.

31. A solder bump structure comprising:

an underbump metallurgy;

a first plated solder layer on the underbump metallurgy;

a second plated solder layer on the first solder layer having higher melting point than the first solder layer; and a third plated solder layer on the second solder layer having lower melting point than the second solder layer;

wherein the first, second and third plated solder layers each includes a plurality of columnar grains that extends across the thickness thereof.

32. A solder bump structure comprising:

an underbump metallurgy;

a first plated solder layer on the underbump metallurgy;

a second plated solder layer on the first solder layer having higher melting point than the first solder layer; and a third plated solder layer on the second solder layer having lower melting point than the second solder layer;

wherein the second plated solder layer is wider than the first plated solder layer and wherein the third plated solder layer is wider than the second plated solder layer.

33. A solder bump structure comprising:

an underbump metallurgy;

a first plated solder layer on the underbump metallurgy;

a second plated solder layer on the first solder layer having higher melting point than the first solder layer; and a third plated solder layer on the second solder layer having lower melting point than the second solder layer;

wherein the solder bump is wider adjacent the third plated solder layer than adjacent the underbump metallurgy.

34. A solder bump structure comprising:

an intermetallic layer comprising an alloy of tin and material other than lead;

an intermediate solder layer comprising lead-tin solder having higher lead content than eutectic lead-tin solder on the intermetallic layer; and an outer solder layer comprising eutectic lead-tin solder on the intermediate solder layer.

35. A structure according to claim 34 wherein the intermetallic layer comprises an alloy of lead and copper.

36. A structure according to claim 34 wherein the intermetallic layer comprises an alloy of lead and nickel.

37. A solder bump structure comprising:

an intermetallic layer comprising an alloy of tin and material other than lead;

an intermediate solder layer on the intermetallic layer; and an outer solder layer on the intermediate solder layer having lower melting point than the intermediate solder layer;

wherein the intermediate solder layer is about 40 microns in thickness and the outer solder layer is at least about 10 microns in thickness.

38. A solder bump structure comprising:

an intermetallic layer comprising an alloy of tin and material other than lead;

an intermediate solder layer on the intermetallic layer; and an outer solder layer on the intermediate solder layer having lower melting point than the intermediate solder layer;

wherein the intermediate solder layer includes a plurality of columnar grains that extend across the thickness thereof.

39. A solder bump structure comprising:

an intermetallic layer comprising an alloy of tin and material other than lead;

an intermediate solder layer on the intermetallic layer; and an outer solder layer on the intermediate solder layer having lower melting point than the intermediate solder layer;

wherein the outer solder layer includes a rounded outer surface.

40. A structure according to claim 38 wherein the outer solder layer includes a rounded outer surface.

41. A solder bump structure comprising:

an intermetallic layer comprising an alloy of tin and material other than lead;

an intermediate solder layer on the intermetallic layer; and an outer solder layer on the intermediate solder layer having lower melting point than the intermediate solder layer;

wherein the outer solder layer is wider than the intermetallic layer.

42. A solder bump structure comprising:

an intermetallic layer comprising an alloy of tin and material other than lead;

an intermediate solder layer on the intermetallic layer; and an outer solder layer on the intermediate solder layer having lower melting point than the intermediate solder layer;

wherein the solder bump structure is wider adjacent the outer layer than adjacent the intermetallic layer.

43. A solder bump structure comprising:

an underbump metallurgy;

a rounded solder bump cap; and a solder bump body between the underbump metallurgy and the rounded solder bump cap, wherein the solder bump is wider adjacent the rounded solder bump cap than adjacent the underbump metallurgy.

44. A solder bump structure according to claim 43 wherein the solder bump body increases in width from adjacent the underbump metallurgy to adjacent the rounded solder bump cap.

45. A solder bump structure according to claim 43 wherein the solder bump body increases continuously in width from adjacent the underbump metallurgy to adjacent the rounded solder bump cap.

46. A solder bump structure according to claim 43 wherein the underbump metallurgy comprises an intermetallic of tin and material other than lead, wherein the solder bump body comprises lead-tin solder having higher lead content than eutectic lead-tin solder, and wherein the rounded solder cap comprises eutectic lead-tin solder.

* * * * *